United States Patent [19]

Yamada et al.

[11] Patent Number: 5,407,907
[45] Date of Patent: Apr. 18, 1995

[54] METHOD OF PREPARING METAL OXIDE CRYSTAL

[75] Inventors: Yasuji Yamada; Teruo Izumi; Kanshi Ohtsu, all of Tokyo; Yuichi Nakamura, Yokohama; Kengo Ishige, Tokyo; Yuh Shiohara, Chigasaki; Minoru Tagami, Funabashi; Shoji Tanaka, Tokyo, all of Japan

[73] Assignees: International Superconductivity Technology Center; Asahi Glass Co., Ltd.; Ishikawajimaharima Jukogyo Kabushiki Kaisha; Sumitomo Metal Industries, Ltd.; Kyushu Electric Power Co.; Railway Technical Research Institute, all of Japan

[21] Appl. No.: 65,148

[22] Filed: May 21, 1993

[30] Foreign Application Priority Data

May 25, 1992 [JP] Japan ................................ 4-132563
Sep. 3, 1992 [JP] Japan ................................ 4-235616

[51] Int. Cl.6 ........................................... C30B 15/02
[52] U.S. Cl. ................................ 505/451; 505/729; 117/33; 117/36
[58] Field of Search .................... 505/1, 729, 451; 156/601, 620.72; 117/14, 15, 28, 33, 36

[56] References Cited

U.S. PATENT DOCUMENTS 4,545,849 10/1985 d'Aragona ................ 156/617 SP
5,057,492 10/1991 Oka et al. ........................ 505/729

FOREIGN PATENT DOCUMENTS 319807   6/1989  European Pat. Off. ............ 505/729
63-310799 12/1988 Japan .................................. 505/729
2275800 11/1990 Japan .................................. 505/729
1587249  8/1977  United Kingdom .

OTHER PUBLICATIONS

Melt Processing of YBaCuO Oxide Superconductors, Fujimoto et al Japanese Journal of Applied Physics, vol. 28, No. 7, Jul. 1989, pp. 1125–1127 Physica C 190 (1991) 64–66, Asaoka et al.
Asaoka, et al, "Growth and Characterization of Polyhedral $YBa_2Cu_3O_x$ Single Crystals," Physica C. Superconductivity, vol. 190, pp. 64–66 (1991).
Takekawa et al, "Single Crystal Preparation of $Ba_2YCu_3O_x$ from Nonstoichiometric Melts," Japanese Journal of Applied Physics, vol. 26, No. 5, May 1987 pp. L851–L853.

Primary Examiner—Robert Kunemund
Attorney, Agent, or Firm—Lorusso & Loud

[57] ABSTRACT

A method of pulling a crystal of a metal oxide is disclosed, in which the growth of the crystal is performed in a liquid phase having a composition which is different from the metal oxide and which contains components constituting the metal oxide. The liquid phase is in contact with a solid phase located at a position separated from the position at which the crystal of the metal oxide grows. The solid phase has a composition different from that of the metal oxide and supplies components constituting the metal oxide to the liquid phase.

19 Claims, 1 Drawing Sheet

METHOD OF PREPARING METAL OXIDE CRYSTAL

BACKGROUND OF THE INVENTION

1. Field of the Invention

This invention relates to a method of preparing a metal oxide crystal and, more specifically, to a method for the growth of a metal oxide crystal.

2. Description of Prior Art

Known methods for the preparation of superconducting metal oxides of a Y-series 123 structure include a flux method, a melt solidification method, a flowing zone (FZ) method, a unidirectional solidification method and a crystal pulling method.

In the flux method, the growth of the metal oxide crystal is performed by lowering the temperature of a relatively homogeneous solution. An improvement of the flux method is suggested in Physica C, 190, 64 (1991), in which peritectic reaction and diffusion in a liquid phase are utilized. The flux method has a problem because it is impossible to continuously grow the desired crystal to a large crystal.

The melt solidification method is a method including the steps of heating a desired metal oxide or a precursor thereof at above the peritectic temperature thereof to form a mixed phase in which a solid phase formed by decomposition and a liquid phase coexist, and then cooling the mixed phase to form the desired crystal of the metal oxide (Jpn. J. Appl. Phys. 28, 1125 (1989); Advances in Superconductivity II, Springer-Verlead, Tokyo, p. 285). While a relatively large crystal can be obtained by this method, it is impossible to continuously prepare the desired crystal without inclusions.

In the unidirectional solidification method, of a raw material in the form of a bar is heated above its peritectic temperature while displacing the heating zone from one end thereof to the other end. While this method permits the continuous preparation of the crystal, it is difficult to form a single phase because the composition of the heating portion varies with the displacement of the high temperature liquefied region. In particular, the desired crystal is apt to be contaminated by a different crystal phase produced by the peritectic reaction.

The FZ method includes heating a raw material in the form of a bar at a higher temperature than that adopted in the above unidirectional solidification method while displacing the heating zone from one end thereof to the other end. This method has a problem because it is difficult to prepare a large crystal. Further, this method is not applicable to the preparation of a Y-series 123 metal oxide crystal, because at such a high temperature, the fused mass begins flowing.

The crystal pulling method includes the steps of providing a solution of the desired crystals in a suitable solvent, immersing a bar of a seed crystal, having a lower temperature than that of the solution, in the solution to form deposits of the desired crystal on the immersed region of the bar, and gradually pulling up the bar to permit the crystal to grow. With this method, however, it is difficult to form a Y-series 123 metal oxide crystal. Further, this method, which uses the primary crystallization temperature, has a problem because the solution has a high viscosity.

SUMMARY OF THE INVENTION

It is, therefore, an object of the present invention to provide a method which can continuously prepare a large oxide crystal.

Another object of the present invention is to provide a method which allows the preparation of a Y-series 123 metal oxide crystal.

It is a further object of the present invention to provide a method which can control the orientation of the crystal and the formation of steps on the crystal growth surfaces and which can prevent crystal twinning.

In accomplishing the foregoing objects, the present invention provides a method of preparing a crystal of a metal oxide, characterized in that the growth of the crystal is performed in a liquid phase having a composition which is different from the metal oxide and which comprises components constituting the metal oxide, in that the liquid phase contains a solid phase at a position different from the position at which the crystal of the metal oxide grows, and in that the solid phase has a composition different from that of the metal oxide and supplies components constituting the metal oxide to the liquid phase.

The method of the present invention can be applied to the preparation of various metal oxides inclusive of crystals which are decomposed to solids and liquid when fused. Both single crystal and polycrystal can be prepared. Superconductive oxides are particularly preferably produced according to the method of the present invention.

Illustrative of suitable metal oxides to be produced by the method of the present invention are Y-series 123 metal oxides, especially superconductive Y-series metal oxides.

The term "Y-series 123 metal oxide" used in the present specification and claims is intended to refer to a metal oxide having the formula:

$AB_2Cu_3O_{7-x}$ wherein A stands for a rare earth element such as Y, B stands for an alkaline earth metal such as Ba and x is a number of 0−1.

The solid phase to be used in the method of the present invention is preferably a Y-series 211 metal oxide.

The term "Y-series 211 metal oxide" used in the present specification and claims is intended to refer to a metal oxide having the formula:

$A_2BCuO_{5-x}$ wherein A, B and x have the same meaning as above.

When, for example, $YBa_2Cu_3O_{7-x}$ of Y-series 123 metal oxide is to be prepared using $Y_2BaCuO_5$ of Y-series 211 metal oxide as the solid phase, the mixed phase (solid phase-containing liquid phase) is preferably obtained by blending the Y-series 211 metal oxide with at least two members selected from the group consisting of a Cu oxide, a Ba oxide and a BaCu oxide to form an admixture, the admixture being subsequently heated at a temperature sufficient to precipitate the primary crystals of the Y-series 123 metal oxide, preferably at a temperature above the incongruent melting point of $YBa_2Cu_3O_{7-x}$ crystal.

In this case, it is necessary that about 3 moles of Ba and about 5 moles of Cu should be present per mole of the Y-series 211 metal oxide, in order to form the Y-series 123 metal oxide by reaction thereof. However, Cu can be present in an excess amount. Thus, the preferred molar ratio of Ba:Cu for the preparation of the liquid phase is 3:5 to 3:8. In the mixed phase, the amount of the liquid phase, i.e. the total amount of the at least two members selected from the Cu oxide, Ba oxide and CuBa oxide, is preferably 2–10 parts by weight per part by weight of the solid phase, i.e. the Y-series 211 metal oxide.

In one preferred embodiment, the growth of the crystal is performed using a seed crystal. The seed crystal is generally an axially elongated body, such as a bar, and is slowly pulled up at a rate of 0.01–10 mm per hour. In the case of the production of a Y-series 123 metal oxide crystal, the pulling speed is preferably 0.1–0.3 mm per hour. The pulling is preferably carried out while rotating the seed crystal bar about the axis thereof at such a rotational speed and in such a rotational direction as to permit the growth of the crystal.

As the seed crystal, it is preferred that a metal oxide having corrosion resistance to the liquid phase be used. In the case of the production of a Y-series 123 metal oxide crystal, a bar formed of $SmBa_2Cu_3O_{7-x}$ crystal, magnesia single crystal or $YBa_2Cu_3O_{7-x}$ crystal is suitably used. The use of $SmBa_2Cu_3O_{7-x}$ seed crystal is particularly preferred for reasons of its crystal structure and high decomposition melting temperature.

In the foregoing descriptions with regard to the solid phase, liquid phase and seed crystal, it is without saying that Y and Ba can be partly or entirely replaced by another rare earth element and another alkaline earth metal, respectively.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
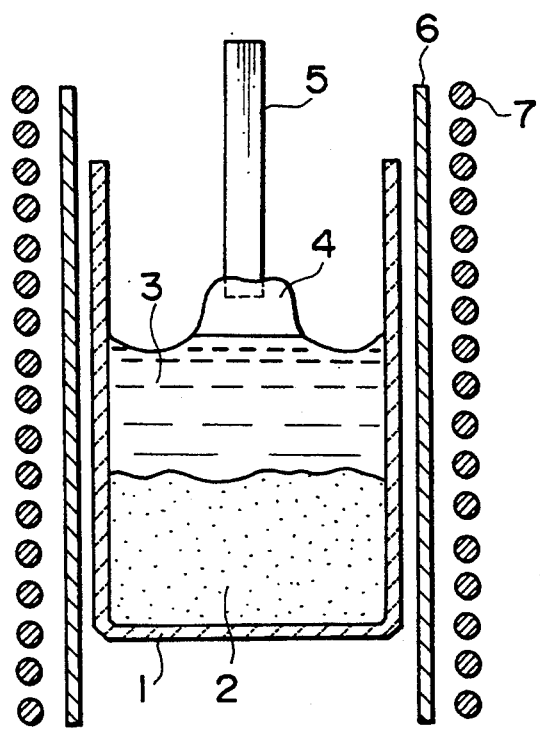
FIG. 1 is a cross-sectional, elevational view diagrammatically showing an apparatus useful for carrying out the method of the present invention.

In practicing the invention, a solid phase-containing liquid phase is first prepared. Thus, raw materials are placed in a crucible formed of a material which does not react with the raw materials and which does not adversely affect the properties of the desired metal oxide crystal, such as yttria, magnesia, alumina or stabilized zirconia. The contents in the crucible are then heated at a temperature sufficient to precipitate a primary crystal of the desired metal oxide. The heating may be effected in any known manner such as with a high frequency induction heating oven or an electric oven.

A seed crystal is then contacted with the liquid phase while controlling the temperature of the liquid phase so as to cause the crystal of the desired metal oxide to deposit on the seed crystal. For reasons of stable growth of the desired crystal, it is preferred that such a temperature gradient that the temperature increases in the direction along which the crystal grows be formed in at least the vicinity of the crystal growth boundary. The growth of the crystal is accelerated by maintaining the surfaces at which the crystal of the metal oxide grows at a temperature lower than a temperature at which the crystal of the metal oxide is stable at equilibrium.

By using a single crystal as the seed crystal and by controlling the crystal orientation of the seed crystal, it is possible to limit the growth of the crystal of the metal oxide to specific direction of the crystal axis. In the initial stage of the crystal growth, the crystals obtained often have crystal faces whose orientations differ from each other. In such a case, it is possible to selectively grow the specific crystal face by removing undesirable crystals to retain only the desired crystal.

It is preferred that the seed crystal bar be axially pulled up while rotating same about the axis thereof. The rotational speed is preferably 10–200 revolutions per minute. In this case, it is also preferred that the rotational speed of the seed crystal bar is reduced with the growth of the crystal of the metal oxide. When the crystal size is not able to be directly measured, the rotational speed of the seed crystal bar may be controlled according to the weight of the crystal of the metal oxide which is monitored with a load cell.

It is preferred that the rotational direction of the elongated body is alternately reversed at suitable intervals, since a single crystal free of contamination with impurities or other defects is obtainable. The switching interval varies with the rotational speed and like conditions but, generally, the rotational direction is shifted at intervals of 5 minutes to 5 hours, preferably 30 minute to 2 hours. The interval may be changed during the growth of the crystal, if desired.

It is important that the surface at which the crystal of the desired metal oxide grows should be spaced from the solid phase contained in (below) the liquid phase, since otherwise the solid phase would be caught by the growing crystal. For the purpose of preventing the contact of the solid phase with the growing crystal, the use of a partition wall therebetween or selection of raw materials so as to create a large difference in density between the smaller density liquid phase and the larger density solid phase is recommended. Preferably, the position at which the crystal of the metal oxide grows is a top surface of the liquid phase and the solid phase is present at the bottom of the liquid phase. In this case, the position at which the crystal of the metal oxide grows is preferably maintained at a temperature not higher than that of the solid phase.

The growth of the crystal of the metal oxide may be performed under any atmosphere such as air. However, the use of an atmosphere with a low oxygen partial pressure is preferable since it is easy to prepare a large single crystal of the tetragonal system. The low oxygen partial pressure atmosphere may be obtained, for example, by feeding a stream of argon to the oven wherein the crystal is grown.

The grown crystal product is desirably taken out of the oven very slowly and carefully so as not to damage the product by thermal shock.

The following examples will further illustrate the present invention.

EXAMPLE 1

$YBa_2Cu_3O_{7-x}$ crystal of Y-series 123 metal oxide was prepared using an apparatus illustrated in FIG. 1. Designated as 1 is a yttria crucible having an inside diameter of 30 mm and a height of 50 mm. The crucible 1 is disposed in a high frequency induction oven having an induction coil 7 with a platinum susceptor 6 being interposed between the crucible 1 and the coil 7. Provided in the bottom of the crucible 1 is a solid phase (precipitate) 2 of $Y_2BaCuO_5$ (Y-series 211 metal oxide) above which a liquid phase 3 is formed. The reference numeral 5 designates a seed crystal bar of $SmBa_2Cu_3O_{7-x}$ crystal. Crystal 4 of the Y-series 123 metal oxide is being grown at the lower end of the seed crystal bar 5.

In commencing the production of the Y-series 123 metal oxide crystal, barium carbonate and copper oxide were mixed with each other with a molar ratio of Ba/Cu of 3:5. This mixture was calcined at 880° C. for 40 hours to obtain a calcined mixture. In the crucible 1 was placed 1 part by weight of $Y_2BaCuO_5$ serving as the solid phase 2, to which was then added 4 parts by weight of the above calcined mixture as a precursor of the liquid phase 3. The crucible 1 was placed inside of the platinum susceptor 6 and the contents in the crucible were heated to about 1,000° C. by energization of the induction coil 6 so that there was formed the liquid phase 3 above the solid phase 2. In this case, the heating was performed so as to establish a temperature gradient of 10° C./cm in the vertical direction of the crucible with an upper portion thereof having a lower temperature than a lower portion thereof.

Figure 2:
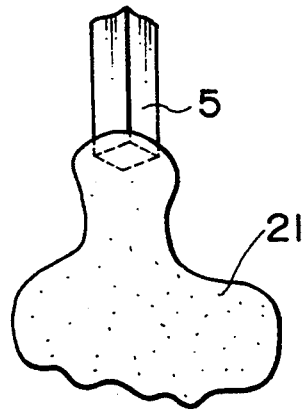
FIG. 2 is a schematic illustration of a grown crystal obtained in Example 1 according to the method of the present invention.

While keeping the solid phase 2 in the precipitated state and maintaining the surface of the liquid phase 3 at a temperature in the range of 1,010°-960° C. the seed crystal bar 5 was immersed in the liquid phase 3 and then continuously pulled up at a rate of 0.2 mm per hour while being rotated at 90 revolutions per minute (rpm), whereby the crystal of $YBa_2Cu_3O_{7-x}$ was allowed to deposit on the seed crystal bar and to grow, as schematically shown in FIG. 1. Thereafter, the seed crystal bar 5 having the grown crystal was taken out of the crucible. This product was as illustrated in FIG. 2. The grown crystal of $YBa_2Cu_3O_{7-x}$ is designated as 21.

EXAMPLE 2

Figure 3:
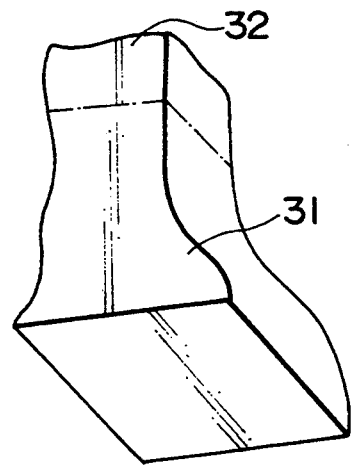
FIG. 3 is a schematic illustration of a grown crystal obtained in Example 2 according to the method of the present invention.

Example 1 was repeated in the same manner as described except that the rotational speed of the seed crystal bar was changed with the growth of the crystal, which was monitored by a load cell, and that the process was performed under a stream of argon. Thus, the rotational speed was initially maintained at 120 rpm for 33 hours from the start of the crystal growth. At this stage, the growing crystal face was a square with a side length of 3 mm. Thereafter, the rotational speed was reduced to 100 rpm and maintained at that speed for 20 hours, whereby the growing crystal face was enlarged to a square of a side length of 5 mm. The rotational speed was then further reduced to 80 rpm and maintained at that speed for 10 hours, to obtain a crystal whose growing face was a square with a side length of 7 mm. The resulting single crystal was taken out of the oven at a speed of 12 mm per hour. Throughout the crystal growth, the seed crystal bar was pulled up at a rate of 0.2 mm per hour and the rotational direction was alternately reversed at intervals of 1 hour. The $YBa_2Cu_3O_{7-x}$ thus prepared was a large single crystal of the tetragonal system and had a shape as shown in FIG. 3, in which the reference numerals 31 and 32 designate the $YBa_2Cu_3O_{7-x}$ single crystal and $SmBa_2Cu_3O_{7-x}$ seed crystal bar, respectively.

EXAMPLES 3 and 4

Example 2 was performed in the same manner as described except that the $SmBa_2Cu_3O_{7-x}$ seed crystal bar was replaced by a MgO single crystal bar (Example 3) and a $YBa_2Cu_3O_{7-x}$ single crystal bar (Example 4), to thereby obtain crystals of $YBa_2Cu_3O_{7-x}$ similar to that obtained in Example 2.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A method of pulling a crystal of a metal oxide from a liquid phase, characterized in that said liquid phase has a composition which is different from said metal oxide and comprises components constituting said metal oxide, in that said liquid phase is in contact with a solid phase at a position Separated by said liquid phase from the position at which said crystal of said metal oxide contacts said liquid phase, and in that said solid phase has a composition different from that of said metal oxide and supplies components constituting said metal oxide to said liquid phase.

2. A method as set forth in claim 1, wherein the crystal of said metal oxide is pulled using an axially elongated body of a seed crystal while rotating said elongated body about the axis thereof at such a rotational speed and in such a rotational direction as to permit the growth of the crystal of said metal oxide.

3. A method as set forth in claim 1, wherein said metal oxide is a superconductive metal oxide.

4. A method as set forth in claim 1, wherein said metal oxide is a Y-series 123 metal oxide.

5. A method as set forth in claim 4, wherein said solid phase is a Y-series 211 metal oxide.

6. A method as set forth in claim 1, wherein said position at which the crystal of said metal oxide grows is maintained at a temperature not higher than that of said solid phase.

7. A method as set forth in claim 1, wherein said solid phase is a blend of a Y-series 211 metal oxide with at least two members selected from the group consisting of Cu oxides, Ba oxides and BaCu oxides, said method comprising heating said blend to a temperature sufficient to precipitate primary crystals of Y-series 123 metal oxide.

8. A method as set forth in claim 2, wherein said seed crystal has corrosion resistance to said liquid phase.

9. A method as set forth in claim 8, wherein said seed crystal is selected from the group consisting of $SmBa_2Cu_3O_{7-x}$ crystal, magnesia single crystal and $YBa_2Cu_3O_{7-x}$ crystal.

10. A method as set forth in claim 2, wherein said elongated body is axially moved upward during the growth of the crystal of said metal oxide and wherein the orientation of said seed crystal relative to the axis of said elongated body is controlled.

11. A method as set forth in claim 2, wherein the rotational direction of said elongated body is alternately reversed at a given interval.

12. A method as set forth in claim 2, wherein the rotational speed of said elongated body is reduced with the growth of the crystal of said metal oxide.

13. A method as set forth in claim 2, wherein the rotational speed of said elongated body is controlled according to the weight of the crystal of said metal oxide which is monitored with a load cell.

14. A method as set forth in claim 1, wherein said position at which the crystal of said metal oxide contacts said liquid phase is at a top surface of said liquid phase and wherein said solid phase is in contact with a bottom surface of the liquid phase.

15. A method as set forth in claim 1, wherein said position at which the crystal of said metal oxide grows is maintained at such a temperature that the crystal of said metal oxide is kept stable.

16. A method as set forth in claim 1, wherein the pulling of the crystal of said metal oxide is performed in an oven containing an atmosphere which induces growth of the crystal in the tetragonal system.

17. A method as set forth in claim 7, wherein the ratio of the weight of said Y-series 211 metal oxide to the total weight of said at least two members is 1:2 to 10:1.

18. A method as set forth in claim 1, wherein the crystal of said metal oxide is a single crystal.

19. A method as set forth in claim 1, wherein the crystal of said metal oxide is a polycrystal.

* * * * *